US010593419B1

(12) United States Patent
Gregor et al.

(10) Patent No.: US 10,593,419 B1
(45) Date of Patent: Mar. 17, 2020

(54) FAILING READ COUNT DIAGNOSTICS FOR MEMORY BUILT-IN SELF-TEST

(71) Applicant: Cadence Design Systems, Inc., San Jose, CA (US)

(72) Inventors: Steven Lee Gregor, Oswego, NY (US); Puneet Arora, Noida (IN); Norman Robert Card, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 104 days.

(21) Appl. No.: 15/894,046

(22) Filed: Feb. 12, 2018

(51) Int. Cl.
 *G11C 29/00* (2006.01)
 *G11C 29/38* (2006.01)
 *G11C 29/44* (2006.01)
 *G11C 29/36* (2006.01)

(52) U.S. Cl.
 CPC .............. *G11C 29/38* (2013.01); *G11C 29/36* (2013.01); *G11C 29/44* (2013.01)

(58) Field of Classification Search
 None
 See application file for complete search history.

(56) References Cited

U.S. PATENT DOCUMENTS

| 7,206,979 B1* | 4/2007 | Zarrineh ............... G11C 29/16 |
| | | 714/718 |
| 2002/0073374 A1* | 6/2002 | Danialy ........... G01R 31/31724 |
| | | 714/738 |
| 2006/0156133 A1* | 7/2006 | Mukherjee ....... G01R 31/31724 |
| | | 714/733 |
| 2009/0172487 A1* | 7/2009 | Damodaran ............ G06F 11/27 |
| | | 714/733 |
| 2010/0174955 A1* | 7/2010 | Carnevale ................ G11C 5/04 |
| | | 714/718 |
| 2011/0010720 A1* | 1/2011 | Smith ...................... G06F 21/00 |
| | | 718/102 |
| 2016/0350196 A1* | 12/2016 | Suga ..................... G06F 11/273 |

OTHER PUBLICATIONS

P. Bernardi and L. Ciganda, "An Adaptive Low-Cost Tester Architecture Supporting Embedded Memory Volume Diagnosis," in IEEE Transactions on Instrumentation and Measurement, vol. 61, No. 4, pp. 1002-1018, Apr. 2012. (Year: 2012).*

* cited by examiner

*Primary Examiner* — Daniel F. McMahon
(74) *Attorney, Agent, or Firm* — Tarolli, Sundheim, Covell & Tummino LLP

(57) ABSTRACT

Systems and methods disclosed herein provide for improved diagnostics for memory built-in self-test ("MBIST"). Embodiments provide for a sequence iterator unit including a diagnostics analysis unit that monitors and reports on the failing read count associated with the tested memory. Embodiments further provide for a bit fail map report that is generated based on the failing read count.

15 Claims, 7 Drawing Sheets

System 100

FIG. 3

| command | address | cycle | rportv | CRC |
|---------|---------|-------|--------|-----|
| w0 | 0 | 0 | 0 | 0 |
| w0 | 1 | 1 | 0 | 0 |
| w0 | 2 | 2 | 0 | 0 |
| w0 | 3 | 3 | 0 | 0 |
| r0 | 0 | 4 | 1 | 1 |
| w1 | 0 | 5 | 0 | 1 |
| r0 | 1 | 6 | 1 | 2 |
| w1 | 1 | 7 | 0 | 2 |
| r0 | 2 | 8 | 1 | 3 |
| w1 | 2 | 9 | 0 | 3 |
| r0 | 3 | 10 | 1 | 4 |
| w1 | 3 | 11 | 0 | 4 |
| r1 | 0 | 12 | 1 | 5 |
| r1 | 1 | 13 | 1 | 6 |
| r1 | 2 | 14 | 1 | 7 |
| r1 | 3 | 15 | 1 | 8 |

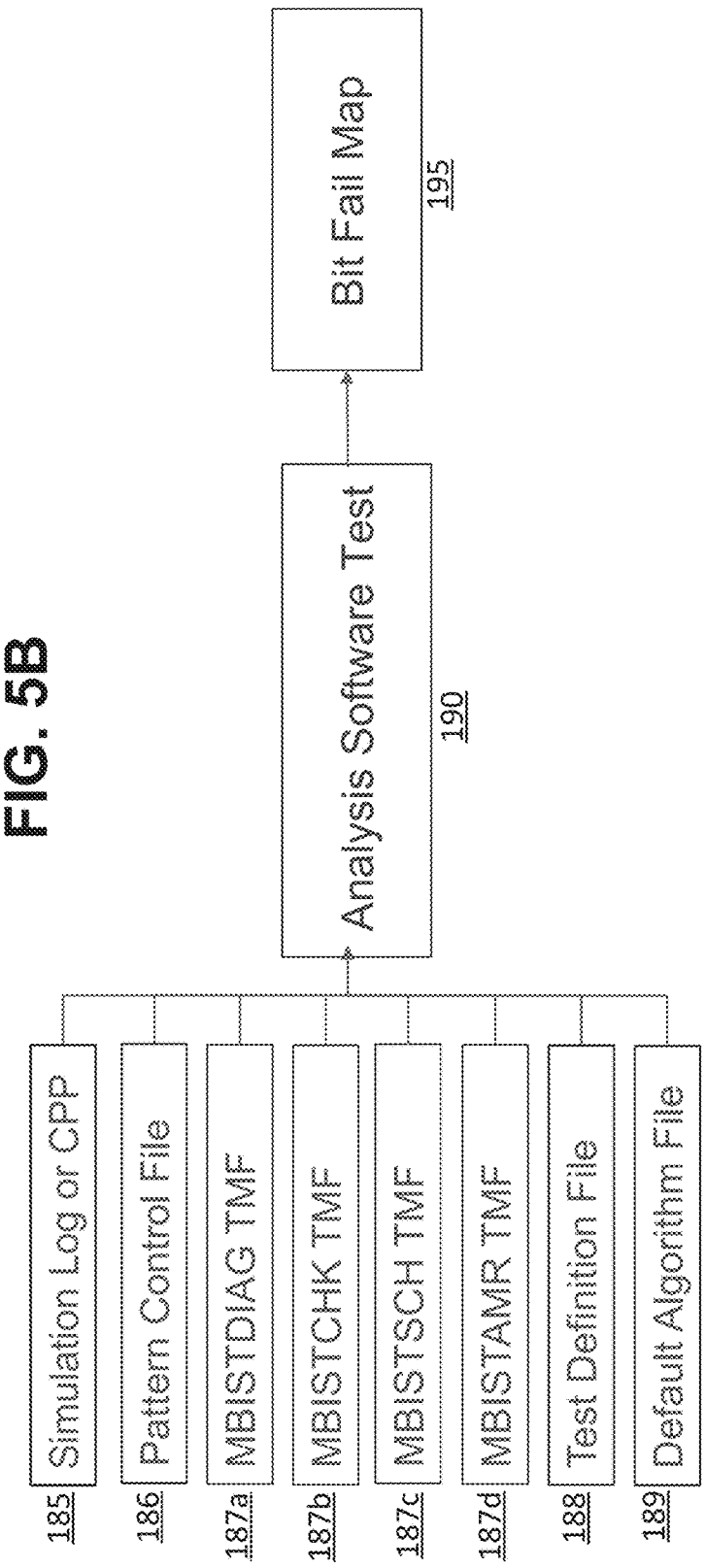

US 10,593,419 B1

FAILING READ COUNT DIAGNOSTICS FOR MEMORY BUILT-IN SELF-TEST

TECHNICAL FIELD

The present application relates to an improved diagnostics system and method for memory built-in self-test.

BACKGROUND

Memory built-in self-test ("MBIST") refers to the self-testing of a memory within an integrated circuit chip. With MBIST, it can be determined if the tested memory includes any failing data bits. Specifically, the MBIST generates a bit fail map report, which indicates the failing data bits during a certain diagnostics test of the memory. Previously, in order to properly test the memory, additional information associated with the failing data bit had to be stored alongside the memory itself. For example, the MBIST hardware included registers for storing the failing algorithm, target, address, and data bits per engine, respectively. In addition, the MBIST hardware also included pipeline stages to retain all of the above information (i.e., failing algorithm, target, address, and data bits per engine) in order to sync failure indication information with other information determined during the diagnostics. All of this additional hardware required significant area in the chip die. For many chip designers, the area taken up by this additional MBIST hardware reduced the amount of actual functionality they were able to put on the chip die. Further, in order to generate the bit fail map report, previous systems required software analysis to be performed after every cycle, i.e., cycle-by-cycle analysis. As such, for diagnostics involving a large amount of stored information (i.e., failing algorithm, target, address, and data bits per engine), there was an associated huge run-time cost as well.

Accordingly, there is a need for an MBIST diagnostics system utilizing less memory and, therefore, less area in the chip die.

BRIEF DESCRIPTION OF THE DRAWINGS

FIG. 3 illustrates a sequence of commands for an algorithm utilized by the MBIST diagnostics system of FIG. 2 in accordance with an example embodiment of the present invention.

FIG. 5B illustrates an example embodiment of the inputs for the analysis software test in FIG. 5A.

FIG. 5C illustrates another embodiment of the bit fail map in FIGS. 5A and 5B.

DESCRIPTION OF EMBODIMENTS

Figure 1:
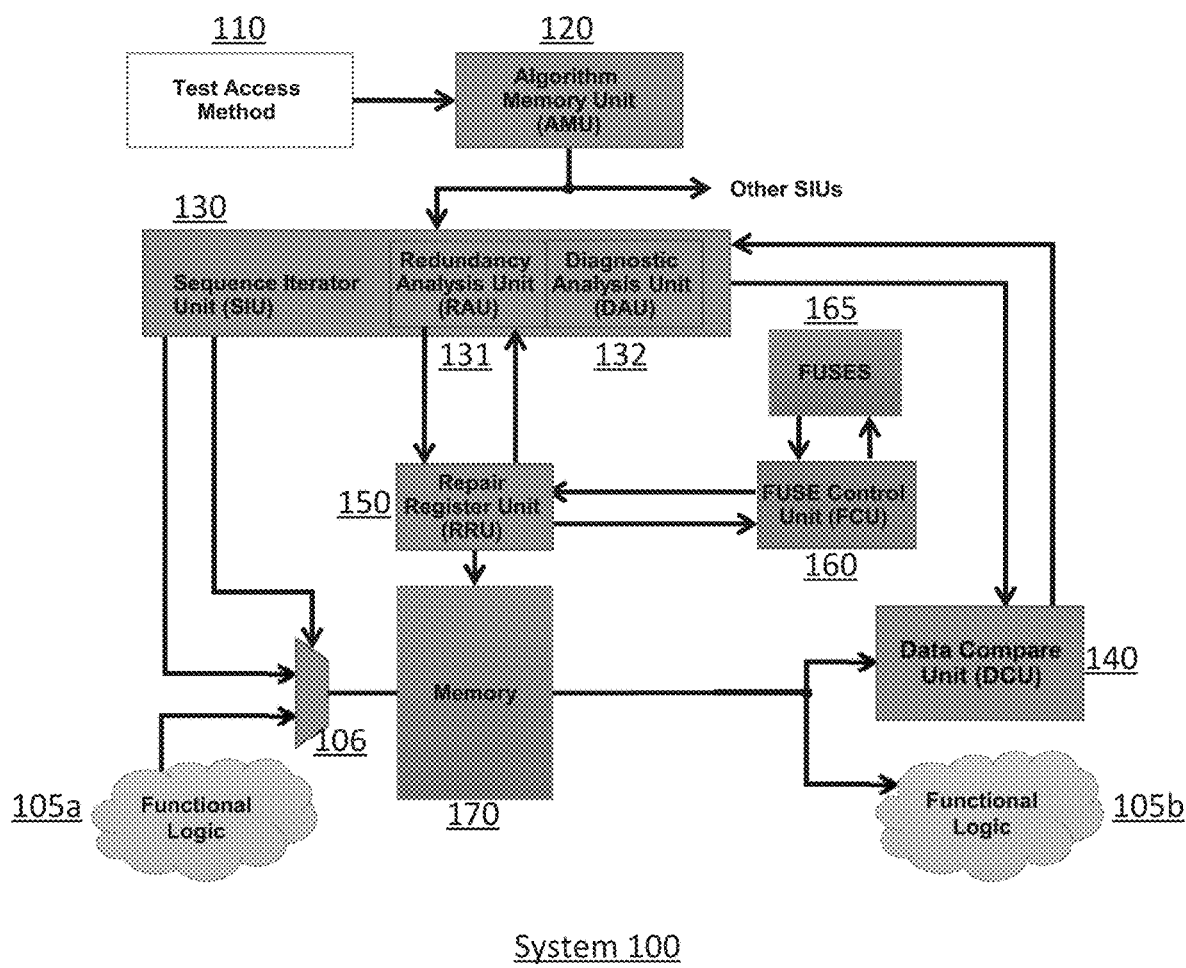
FIG. 1 illustrates an example embodiment of an MBIST diagnostics system.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide MBIST diagnostics systems and methods utilizing less memory and, therefore, less area in the chip die. The systems and methods herein address at least one of the problems discussed above.

According to an embodiment, an MBIST diagnostics system includes a memory; at least one sequence iterator unit including a diagnostic analysis unit; a data compare unit; and a processor, wherein: the at least one sequence iterator unit is configured to (i) generate read command and address instructions associated with an algorithm to provide to the memory and (ii) provide expected read data associated with the algorithm to the data compare unit; the data compare unit is configured to (i) compare the expected read data with an output of the memory and (ii) provide a result of the comparison to the diagnostic analysis unit; upon determining at least one mis-compare between the output of the memory and the expected read data, the diagnostic analysis unit is configured to generate a corresponding read command count associated with each mis-compare; and the processor is configured to generate a bit fail map report based on the read command count, wherein the bit fail map report includes information associated with the at least one mis-compare.

According to an embodiment, a diagnostics method for MBIST includes: generating, with at least one sequence iterator unit, read command and address instructions associated with an algorithm to provide to a memory; providing, with the at least one sequence iterator unit, expected read data associated with the algorithm to a data compare unit; comparing, with the data compare unit, the expected read data with an output of the memory; providing, with the data compare unit, a result of the comparison to a diagnostic analysis unit; upon determining at least one mis-compare between the output of the memory and the expected read data, generating, with the diagnostic analysis unit, a corresponding read command count associated with each mis-compare; generating, with the processor, a bit fail map report based on the read command count, wherein the bit fail map report includes information associated with the at least one mis-compare.

FIG. 1 illustrates an example embodiment of an MBIST diagnostics system. As depicted in the figure, MBIST diagnostics system 100 includes a test access method ("TAM") 110, algorithm memory unit ("AMU") 120, sequence iterator unit ("SIU") 130, data compare unit ("DCU") 140, repair register unit ("RRU") 150, fuse control unit ("FCU") 160, fuses 165, and memory 170. In an embodiment, the TAM 110 is a means of communicating from outside the chip. In an embodiment, the TAM 110 can be implemented through either a "Joint Test Action Group" ("JTAG") or "Direct Access" interface. In an embodiment, the JTAG interface includes a plurality of pins (e.g., four or five pins) that are utilized to extract test information during the memory test. In an embodiment, the "Direct Access" interface corresponds to a different set of pins that doesn't require quite the complexity of the JTAG interface. For example, the "Direct Access" interface only requires a set of two pins. Further, because the "Direct Access" pins can be shared with some other ports, no additional overhead is required. Therefore, in an embodiment, the "Direct Access" interface can internally mimic the behavior of JTAG Macros but, instead, with minimum area requirements. In an embodiment, the AMU 120 contains the programs (e.g., algorithms) that run in the MBIST logic against the memory 170. In an embodiment, the AMU 120 distributes the above program information into the SIU 130. Specifically, a program previously-loaded onto the AMU 120 is distributed one line at a time to the SIU 130. In an embodiment, the SIU 130 generates the command and address sequence of the data that gets presented to the memory 170 when (i) data is being written onto the memory 170, (ii) data is being presented for comparison, and (iii) the memory 170 is being read. In an embodiment, the SIU 130 may include a plurality of other units. For example, the SIU may include a redundancy analysis unit ("RAU") 131 and a diagnostics analysis unit ("DAU") 132. In an embodiment, the RAU 131 determines (i) what the failures look like within a given memory and (ii) whether or not redundant resources can be utilized to repair the failures. In an embodiment, the DAU 132 counts the read requests. The read count at which a failure occurs is then communicated to an analysis software test via a file indicating the mis-compares (e.g., a simulation log or chip pad pattern file). Specifically, the DAU 132 looks for patterns in the memories to determine whether or not the memory has problems or whether there's some problem associated with the die or the process. Accordingly, the DAU 132 provides another level of analysis below the RAU 131. Further, in an embodiment, the RRU 150 controls the hard or soft repair on the memory 170, e.g., via the FCU 160 and the fuses 165, based on instructions from the RAU 131. In an embodiment, the SIU 130 feeds both (i) the command and address sequence into the memory 170 and (ii) expected data into a first input of the DCU 140. Then, based on the command and address sequence fed into the memory 170, the memory 170 generates an output, which is received by another input of the DCU 140. In an embodiment, the DCU 140 compares the expected data from the SIU 130 with the output from the memory 170. In an embodiment, the expected data from the SIU 130 is received by the DCU 140 at the same time as the output from the memory 170. In an embodiment, based on the comparison, the DCU 140 is then able to determine if the memory 170 includes any failing data bits. For example, if the DCU 140 determines that the expected value is equivalent to the output from the memory 170, then it is likely that the associated data bit is functioning properly. However, if the DCU 140 detects a mis-compare, then it is likely the associated data bit is not functioning properly, i.e., failing. After the comparison, the DCU 140 transmits the result of the comparison, i.e., working or failing, to the SIU 130 for further processing by at least one of the RAU 131 and the DAU 132. In an embodiment, a working bit may be associated with a logical value of "0" while a failing bit may be associated with a logical value of "1." Further, in an embodiment, the system 100 also includes functional logic 105a and 105b and a multiplexer 106. In an embodiment, the multiplexer 106 allows either (i) the data from the SIU 130 to be fed into the memory 170 during a test or (ii) via the regular functional path, e.g., the functional logic 105a into the memory 170. On the output side of the memory 170, the output goes to the DCU 140 for comparison purposes and also to the non-test mode logic of the design, e.g., functional logic 105b. In an embodiment, the system 100 can also include a plurality of other SIUs 130. In an embodiment, each SIU 130 contains its own DAU 132. As such, each SIU 130 can interact with one or more memories 170 and associated DCUs 140.

Figure 2:
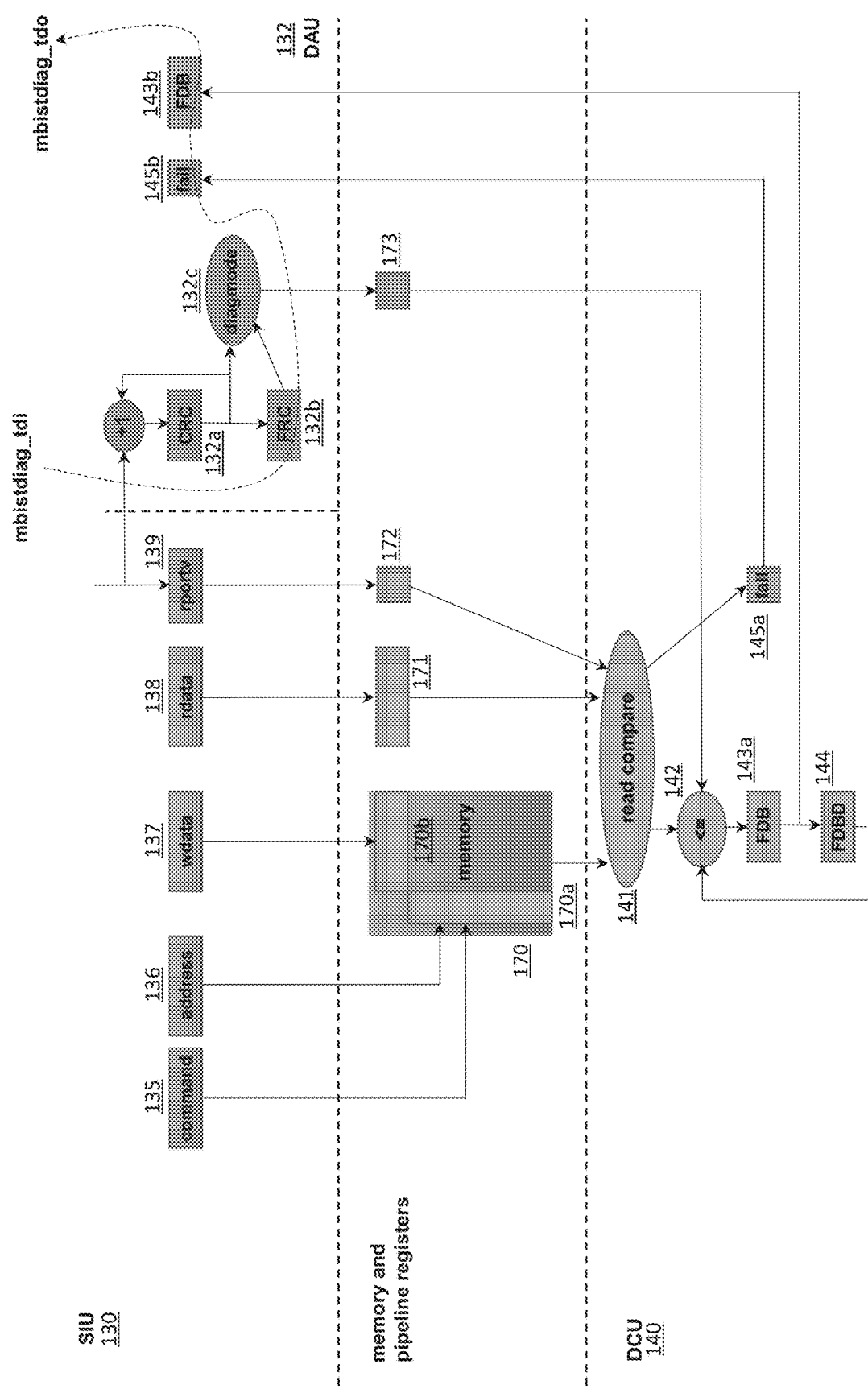
FIG. 2 illustrates an interaction between the elements of the MBIST diagnostics system of FIG. 1 in accordance with an example embodiment of the present invention.

FIG. 2 illustrates an interaction between the elements of the MBIST diagnostics system of FIG. 1 in accordance with an example embodiment of the present invention. Specifically, FIG. 2 depicts the interaction between the SIU 130, the DCU 140, and the memory 170. In an embodiment, the SIU 130 includes command register 135, address register 136, wdata register 137, rdata register 138, and rportv register 139. In an embodiment, the SIU 130 decomposes an algorithm into a set of instructions, i.e., command, address, wdata, rdata, and rportv, which are then stored in their respective registers. The command instruction is one of read or write. The address corresponds to the location within the memory 170 to be accessed. Wdata is the data to be written into the memory 170 on a write command. Rdata is the data to be compared against the contents read from the memory 170. Rportv indicates that a valid read command is being processed. As further depicted in the figure, the DAU 132 includes a current read count ("CRC") register 132a, a failing read count ("FRC") register 132b, and diagmode signal 132c. Further, in an embodiment, the DCU 140 includes read compare logic 141, fail compare logic 142, failing data bit ("FDB") register 143a, failing data bit detect ("FDBD") register 144, and fail signal register 145a. In an embodiment, FIG. 2 also depicts a plurality of memory and pipeline registers (i.e., registers 170a, 170b, 171, 172, and 173) used in conjunction with the memory 170 and other registers during the test of the memory 170. In an embodiment, the CRC register 132a monitors the CRC and increments each time a read command is sent to the memory. In an embodiment, if a failure should occur at a certain read command, the CRC associated with the failure, i.e., the FRC, is captured into the FRC register 132b. Further, in an embodiment, the diagmode signal 132c is a control signal sent to the DCU 140 and is also utilized within the DAU 132. In an embodiment, the diagmode signal 132c controls when to capture the CRC, as indicated in the CRC register 132a, into the FRC 132b. Further, the diagmode signal 132c also controls whether to capture the value in the FDB register 143a into the FDBD register 144. In an embodiment, the diagmode signal 132c can be one of "00," "01," and "10." If the diagmode signal 132c is "00," then the CRC is less than the FRC and, therefore, no failures should be registered in the DCU 140. If the diagmode signal 132c is "01," then the CRC is equal to the FRC and, therefore, the next FDB should be registered in the DCU 140. Lastly, if the diagmode signal 132c is "10," then the CRC 132a is greater than the FRC 132b and, therefore, the failure should be registered in the DCU 140. In an embodiment, the read compare logic 141 compares all the memory read (i.e., actual) data against the rdata (i.e., expected) content in order to generate (i) a fail signal, which is stored locally in the fail signal register 145a and (ii) the FDB, which is (a) stored in the FDB register 143a and (b) represents an encoded index of the first failure detected in the comparison starting at the most significant data bit position. In an embodiment, the fail compare logic 142 calculates the FDB based on the diagmode signal 132c controls. This permits all FDBs to be detected and reported. In an embodiment, the first time a memory address is read with a detected failure: (i) the diagmode signal 132c is "10," (ii) the most significant FDB is registered, and (iii) the values associated with the most significant FDB is saved in the FDBD register 144. Further, in an embodiment, the fail signal stored at the fail signal register 145a and the FDB stored at the FDB register 143a are reported back to the DAU 132. For example, the fail signal is reported to another fail signal register 145b located at the DAU 132. Similarly, the FDB is reported to another FDB register 143b located at the DAU 132. This permits the capture of the fail signal, FDB, and FRC to present a consistent view of the captured failure to the software for subsequent analysis. In an embodiment, the FRC is adjusted downwards from the CRC value once the fail signal is received to account for the pipeline stages of delay necessary between the initial presentation of the read command and the eventual failure capture in the DAU 132. In an embodiment, the fail signal, FDB, and FRC are captured by a test data register ("TDR"), e.g., MBISTDIAG, that can be accessed by a tester (not shown) via the TAM 110. In an embodiment, the fail signal, FDB, and FRC are captured via the input of the TDR, e.g., mbistdiag_tdi. Further, the tester accesses the information on the TDR via the output of the TDR, e.g., mbistdiag_tdo. In an embodiment, the TDR shifts information out to the tester to be measured after each cycle. In an embodiment, the pipeline stages are associated with the memory and pipeline registers (i.e., registers 170a, 170b, 171, 172, and 173) used in conjunction with the memory 170 and other registers during the test of the memory 170. For example, register 170a temporarily stores the command and address information provided by the command register 135 and the address register 136, respectively. Register 170b temporarily stores the data to be written into memory 170 provided by the wdata register 137. Register 171 temporarily stores data to be compared against the contents read from the memory 170 provided by the rdata register 138. Register 172 temporarily stores the indication that a valid read command is being processed provided by the rportv register 139. Lastly, register 173 temporarily stores the control signal provided by the diagmode signal 132c. In an embodiment, each of the registers 132a, 132b, 132c, 135, 136, 137, 138, 139, 143a, 143b, 144, 145a, 145b, 170a, 170b, 171, 172, and 173 are clocked on the rising edge of a clock cycle.

FIG. 3 illustrates a sequence of commands for an algorithm utilized by the MBIST diagnostics system of FIG. 2 in accordance with an example embodiment of the present invention. In an embodiment, a number of pre-defined and user-defined algorithms can be utilized by the MBIST diagnostics system 100. Pre-defined algorithms are built into an application. User-defined algorithms are defined in the configuration file. In an embodiment, the command sequences depicted in FIG. 3 are associated with the following sample algorithm:
{
(w0)
(r0,w1)
(r1)
},
where "w0" corresponds to a write true background command, "r0" corresponds to a read true background command, "w1" corresponds to a write complement background command, and "r1" corresponds to a read complement background command.

In an embodiment, the set of commands in each parenthesis is executed against each address in the memory before moving onto the next line. Further, the command sequences depicted in FIG. 3 assume a memory that is four words in size with addresses 0, 1, 2, and 3, respectively. As depicted in the figure, a command instruction is presented to a targeted memory address at a certain clock cycle. Further, the rportv indicates when a read command is active in a given cycle. Lastly, the CRC accumulates the read command count during the execution of the algorithm.

Figure 4A:
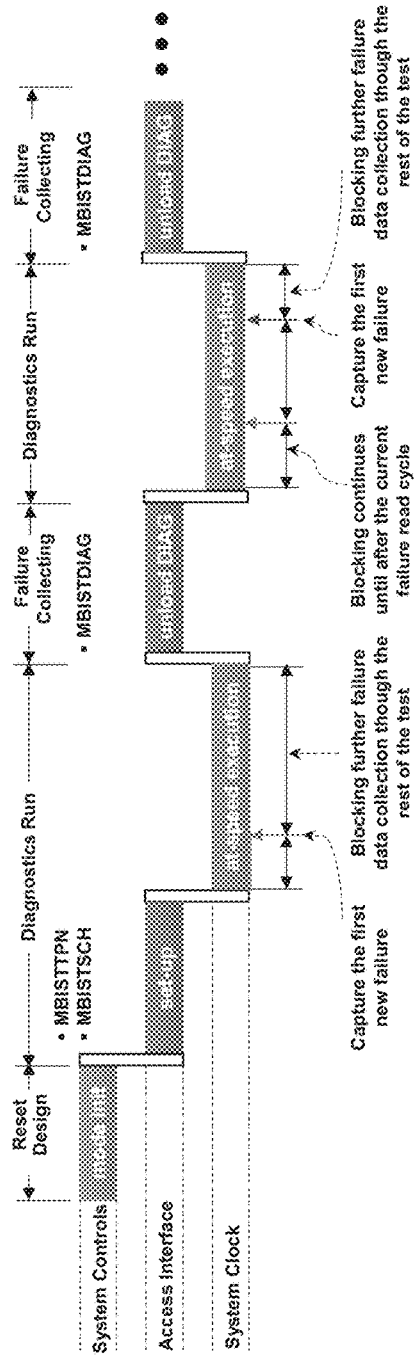
FIG. 4A illustrates an example embodiment of a diagnostics method utilized by the MBIST diagnostics system of FIG. 2.

FIG. 4A illustrates an example embodiment of a diagnostics method utilized by the MBIST diagnostics system of FIG. 2. In an embodiment, FIG. 4A depicts a "capture-and-rerun" diagnostics method. As depicted in the figure, the "capture-and-rerun" diagnostics method includes a "reset design" mode, a "diagnostics run" mode, and a "failure collecting" mode. During the "reset design" mode, the MBIST logic (including the DAU 132) will be reset to an initial state. Further, the first "diagnostics run" mode includes a "set-up" phase and an "at-speed execution" phase. During the "set-up" phase, the system 100 retrieves information from a test plan register (e.g., MBISTTPN) and a target scheduling register (e.g., MBISTSCH). In an embodiment, the test plan register includes information regarding the selected set of test plans that are going to be run against the memory during the particular diagnostics method, e.g., "capture-and-rerun." In an embodiment, a test plan includes a set of one or more algorithms as well as a set of test conditions associated with the algorithms. In an embodiment, the test conditions may include the address order (e.g., fast column, fast row, or fast diagonal), the address update (e.g., linear or complement), the data background, and the sequence iterator. In an embodiment, the test scheduling register includes the scheduling information for the set of target memories that are going to be running a particular set of test plans. Once the tester retrieves the appropriate information from the test plan register and the target scheduling register, the system 100 performs a first pass of the selected test during the "at-speed execution" phase. As depicted in the figure, after a first new failure is captured by a TDR (e.g., MBISTDIAG), the system 100 is blocked from further failure data collection through the rest of test. As explained above, the TDR captures the first new failure encountered on each pass and records the FRC and the FDB. After the first pass of the test, the captured failure information (e.g., FRC and FDB) is unloaded onto a tester, e.g., automated test equipment ("ATE"), during the "failure collecting" mode. In an embodiment, the tester compares the unloaded failure information against expected values in order to generate a log file including any resulting miscompares. In an embodiment, the log file is stored at a memory in the tester. Then, as depicted in the figure, during the next "at-speed execution" phase, the system 100 performs another pass of the selected test. However, during this pass, failure data collection is blocked until after the test gets past the previously-captured failure information. Then, after the next new failure is captured, the system 100 blocks further failure data collection for the duration of the test. The captured next new failure is then unloaded onto the tester. In an embodiment, the system 100 will go through multiple passes of the algorithm until it has found all of the failures or it hits a predetermined failure limit. In an embodiment, the algorithms utilized during the "capture-and-rerun" diagnostics method can either be hardwired-in or programmed. In an embodiment, hardwired algorithms are compiled in the MBIST hardware and, therefore, are embedded in the hardware itself. Accordingly, once they're built, they cannot be changed. Further, although programmed algorithms are not compiled in MBIST hardware, they do require additional logic or JTAG controls. For example, most programmed algorithms are stored in an additional shift register, e.g., MBISTAMR. Further, the programmable algorithms are programmable (e.g., modifiable) based on the limits defined by either software or a user, e.g., a chip designer.

Figure 4B:
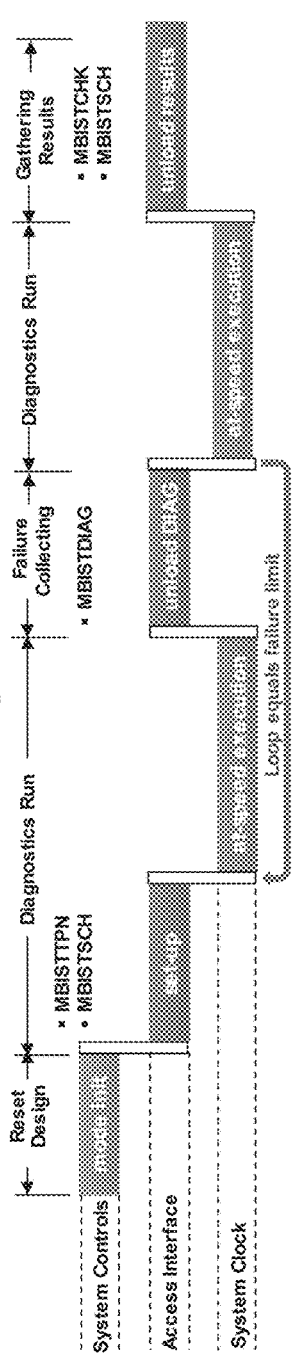
FIG. 4B illustrates a hardwired embodiment of the diagnostics method in FIG. 4A.

FIG. 4B illustrates a hardwired embodiment of the diagnostics method in FIG. 4A. As described above, because the algorithms are already embedded in the hardware itself, the hardware embodiment does not require any additional registers and, therefore, follows the diagnostic method in FIG. 4A. In addition, as depicted in the figure, after the diagnostic process hits the failure limit, the results from the diagnostic process are gathered for further analysis during the "gathering results" mode. For example, if a failure was indicated during the running of a test plan for a set of devices, that information would be captured in a separate register (e.g., MBISTCHK) so that further analysis can determine the particular conditions when that failure happened. Further, the target scheduling register (e.g., MBISTSCH) is also provided at the "gathering results" mode.

Figure 4C:
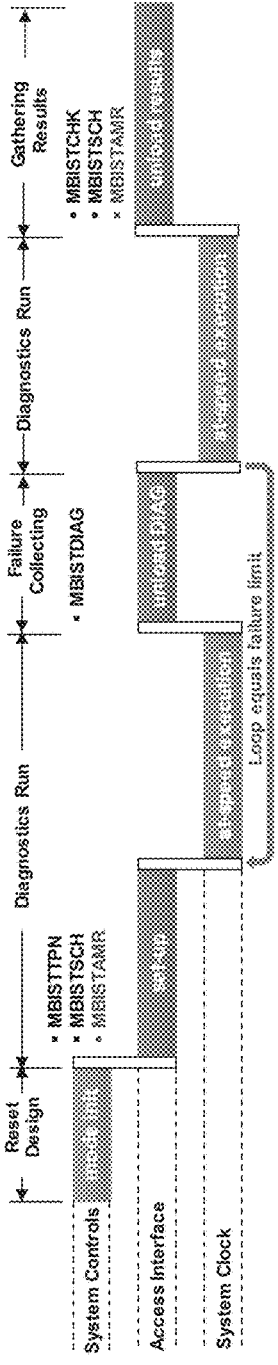
FIG. 4C illustrates a programmed embodiment of the diagnostics method in FIG. 4A.

FIG. 4C illustrates a programmed embodiment of the diagnostics method in FIG. 4A. As depicted in the figure, unlike the hardwired embodiment in FIG. 4B, the programmed embodiment includes an additional shift register, e.g., MBISTAMR. In an embodiment, the algorithm(s) used during the diagnostic process is loaded from the additional shift register. As further depicted in the figure, that same additional shift register is also provided at the "gathering results" mode.

Figure 5A:
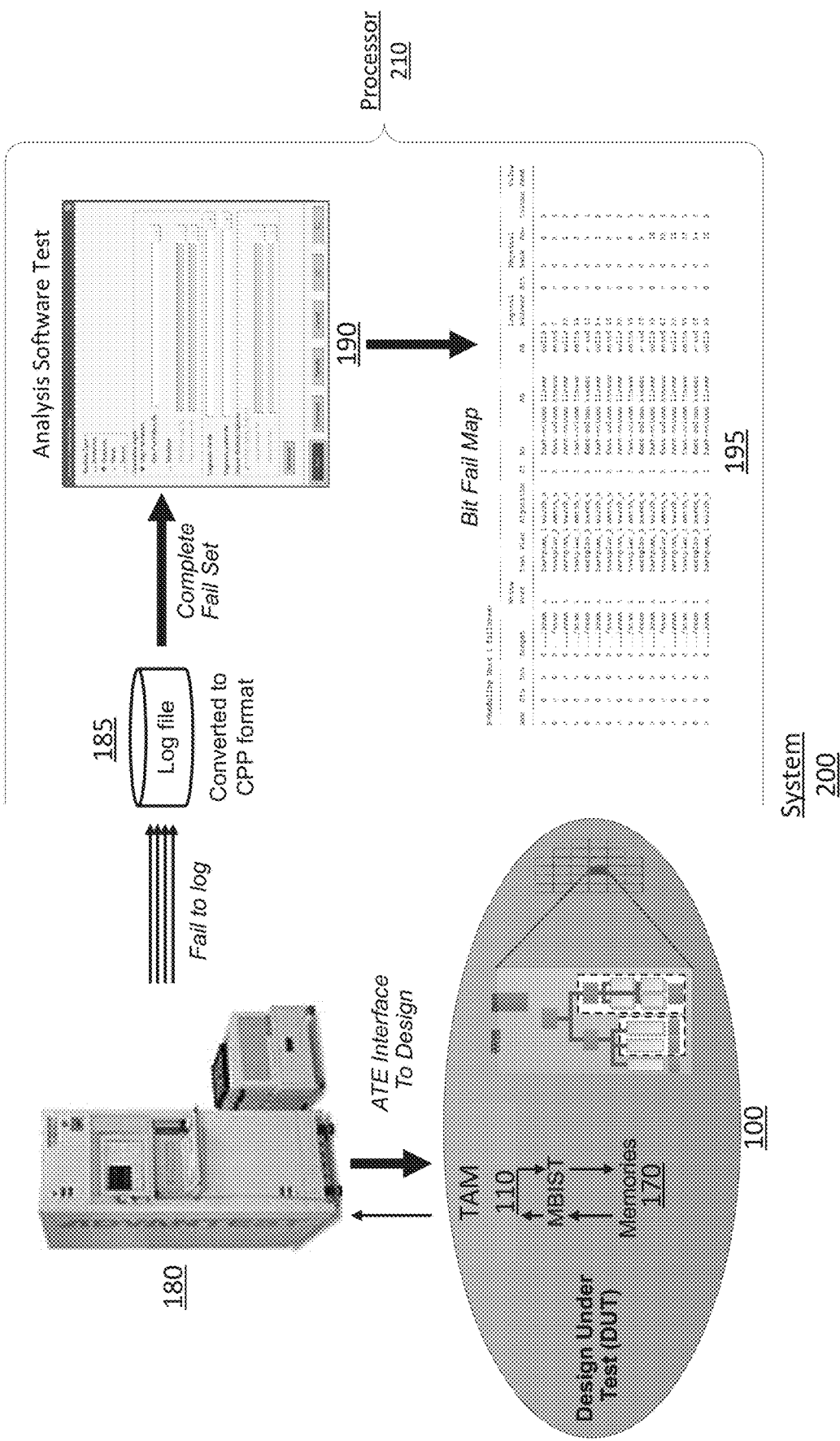
FIG. 5A illustrates a diagnostics system in accordance with an example embodiment of the present invention.

FIG. 5A illustrates a diagnostics system in accordance with an example embodiment of the present invention. In an embodiment, as depicted in FIG. 5A, a diagnostic system 200 includes the MBIST diagnostic system 100, an ATE 180, a log file 185, an analysis software test 190, a bit fail map report 195, and a processor 210. In an embodiment, the MBIST diagnostic system 100 may interact with the ATE 180 via the TAM 110. In an embodiment, the ATE 180 retrieves the relevant fail information from the TDR after each pass of the algorithm test. Specifically, each time information is shifted out of the TDR, it gets measured by the ATE 180. As discussed above, the ATE 180 generates mis-compare information based on the relevant failure information and stores the generated mis-compares in a log file, e.g., the log file 185. In an embodiment, the log file 185 also includes information regarding particular tester cycle and cycle count for each detected mis-compare. As such, based on the log file 185, it can be determined for which die, and on which wafer, the mis-compare occurred. In an embodiment, the log file 185 is stored in a memory in the tester and in a format that is unique to that tester. In an embodiment, once the ATE 180 goes through the desired number of passes, it generates (e.g., prints) the complete log file 185 in the tester-specific format. After which, the generated log file 185 is converted into a generic format, e.g., chip pad pattern ("CPP") format. Then, as depicted in the figure, the converted log file 185 is provided to the analysis software test 190 to generate the bit fail map report 195. In an embodiment, the conversion of the generated log file 185 into the CPP format, the analysis software test 190, and the bit fail map report 195 are implemented with the processor 210.

FIG. 5B illustrates an example embodiment of the inputs for the analysis software test in FIG. 5A. For example, in addition to the converted CPP log file 185, the analysis software test also receives a pattern control file 186, a plurality of TDR mapping files ("TMFs") 187*a-d* (e.g., MBISTDIAG, MBISTCHK, MBISTSCH, MBISTAMR), a test definition file 188, and a default algorithm file 189. In an embodiment, as discussed above, the CPP log file 185 includes the mis-compare information (e.g., tester cycle and cycle count information for each detected mis-compare) associated with a particular test of the memory. Further, in an embodiment, the pattern control file 186 includes information about all of the inserted MBIST hardware as well as the features associated with each of the memories being tested. Further, in an embodiment, TMF 187*a*, e.g., MBISTDIAG, includes the relevant failure information (e.g., fail signal, FDB, and FRC) associated with a particular test of the memory. Further, in an embodiment, TMF 187*b*, e.g., MBISTCHK, includes which data bits actually mis-compared during a test of a particular set of devices and, therefore, can be utilized to indicate if there was a failure during the test (i.e., by correlating the mis-compare information from the CPP log file 185 to the data bits that actually mis-compared during the test). Accordingly, if TMF 187*b* indicates that there was no failure during the test of the particular set of devices, a simulation of the test with the analysis software test will not be necessary. On the other hand, if TMF 187*b* indicates that there was a failure during the test of the particular set of devices, a simulation of the test with the analysis software test will be necessary. Further, in an embodiment, TMF 187*c*, e.g., MBISTSCH, includes the scheduling information for the set of target memories that are going to be running a particular set of test plans. Further, in an embodiment, TMF 187*d*, e.g., MBISTAMR, includes the programmed test plans. In an embodiment, the TMF 187*d* is only included if programmed test plans are utilized. On the other hand, if the test plans are hardwired-in, the TMF 187*d* is not necessary. Further, in an embodiment, the test definition file 188 includes the configuration information for the MBIST hardware, test plans, and algorithms utilized during a particular test. In an embodiment, when the TMF 187*d* is unloaded and analyzed in the analysis software test (e.g., via mis-compares), the resultant string can be used to search in the test definition file 188 to locate a specific algorithm for a programmed test plan. Further, the test definition file 188 also indicates if the algorithm being tested is hardwired or programmed. Further, in an embodiment, the default algorithm file 189 contains the definitions for each of the algorithms. For example, an algorithm can be defined as follows:

algorithm
{
  name connectivity
  {
    (w0,r0)
    (r0,w1)
    dn(w1,r1)
    dn(r1,w0)
  }
}

In an embodiment, the analysis software test performs the same operations in software as performed in the MBIST hardware. For example, the analysis software test keeps track of read count and current state. In an embodiment, when read count matches a failing read count (e.g., as identified through unload of MBISTDIAG from the simulation patterns), all the information necessary to report the failing address, bit, testplan, etc. is known. An example of the software emulation of the hardware loop is provided below:

```
Initialize address partition information for each active device
    Each address consists of row, column and bank bits (where column and bank bits are
optional)
    The address partition information in the pattern control file identifies how the bits are
grouped
    These values are incremented based on the address order (fast-row means row bits are
increased first).
        Ex: address_partition={ row 6:2 column 0:1 }and address order = fast-row
            address counter=0 address value (binary) = 00000 00 address value (decimal) = 0
            address counter=1 address value (binary) = 00001 00 address value (decimal) = 4
            address counter=2 address value (binary) = 00010 00 address value (decimal) = 8
            address counter=3 address value (binary) = 00011 00 address value (decimal) = 12
            . . . . . . . .
            address counter=31 address value (binary) = 11111 00 address value (decimal) = 124
            address counter=32 address value (binary) = 00000 01 address value (decimal) = 1
            . . . . . . . .
Initialize a read count for each engine (siu) to 0
For each algorithm in the testplan
        For or each address order
            For each address update
                For each data background
                    If au = twos power
                        si_loop_max = number of bits needed to represent: max
                        address width of active devices rounded to nearest power
                        of 2
                    Else
                        si_loop_max = 1
                    For wp = 1 to max number of(write ports + read/write
                    ports) for active devices
                        for si_loop = 0 to si_loop_max
                            Loop through each sequence iterator for current
                            algorithm
                                For address=0 to max address width of active
                                devices rounded to nearest power of 2
                                    For each active device, apply address
                                    transformations to determine actual address:
                                        address order, address update and address
                                        direction
                                    For each memory access in the current sequence
                                    iterator
                                        If memory access is a read access
                                            Increase read count for active engine
                                            Save current state information, this
                                            information includes:
                                                - algorithm
                                                - address order
                                                - address update
                                                - sequence iterator
                                                - data background
                                                - write port
                                                - address
                                                - memory access
Reset address partition after address loop.
```

In an embodiment, in order to minimize the software execution time, the software loop is only executed up to the maximum failing read count. In an embodiment, the bit fail map report 195 is generated at the conclusion of the analysis software test 190.

FIG. 5C illustrates another embodiment of the bit fail map in FIGS. 5A and 5B. In an embodiment, as depicted in the figure, the bit fail map report 195 includes information regarding the particular hardware used during test. For example, the bit fail map report 195 includes information regarding the particular AMU, SIU, and DCU used during the test. In addition, the bit fail map report 195 also includes information of the particular device targeted during the test. Further, the bit fail map report 195 also includes the state information associated with the test plan executed during the test. For example, the bit fail map report 195 includes information regarding the particular algorithm, address order ("AO"), address update ("AU"), sequence iterator ("SI"), data background ("DB"), and write port utilized during the test. Further, the bit fail map report 195 also includes the physical and logical address of the memory accessed during the test.

Figure 6:
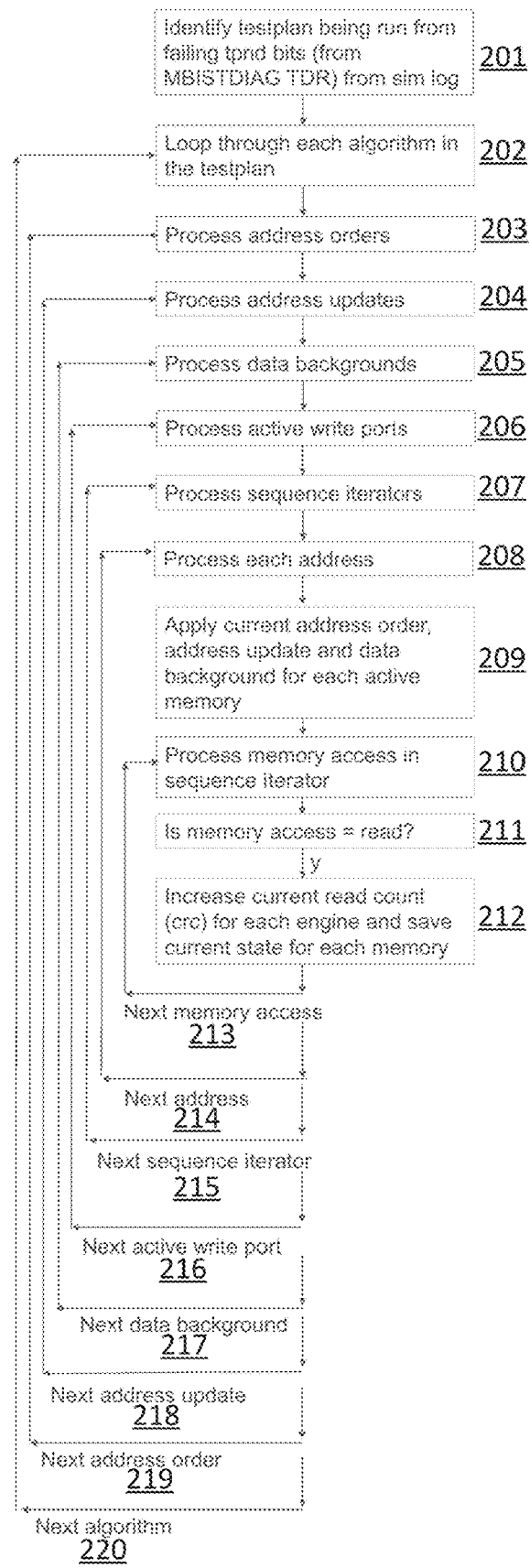
FIG. 6 illustrates an example embodiment of a method utilized by the analysis software test in FIGS. 5A and 5B.

FIG. 6 illustrates an example embodiment of a method utilized by the analysis software test in FIGS. 5A and 5B. As depicted in the figure, in step 201, the test plan being run is identified from the failing test plan data ("TPND") bits (e.g., from the MBISTDIAG TDR) in the CPP simulation log file 185. In other words, based on the particular mis-comparing data bits in the CPP simulation log file 185, it can be determined which test plan was running when the mis-compares occurred (i.e., by correlating the mis-compare information in the MBISTDIAG TDR with the test plan information in the pattern control file 186). Then, based on the identified test plan, each of the associated algorithms is processed. For example, as depicted in step 202, a first algorithm is processed. In an embodiment, in processing the first algorithm, an associated first address order (e.g., fast column, fast row, or fast diagonal) is processed as depicted in step 203. Further, in processing the first address order, an associated first address update (e.g., linear or complement) is also processed as depicted in step 204. Further, in processing the first address update, an associated first data background is also processed as depicted in step 205.

Further, in processing the first data background, an associated first active write port is also processed as depicted in step 206. Further, in processing the first active write port, an associated first sequence iterator is also processed as depicted in step 207. Further, in processing the first sequence iterator, an associated memory address is also processed as depicted in step 208. Then, as depicted in step 209, the current address order, address update, and data background is applied to each active memory. Then, as depicted in step 210, the memory access is processed in the sequence iterator. Then, as depicted in step 211, it is determined if the memory access was a read operation. If the memory access was a read operation, then, as depicted in step 212, (i) the current read for the sequence iterator (e.g., engine) is increased and (ii) the current state for each memory is saved. Then, as depicted in step 213, the next memory access in the sequence iterator is processed. In an embodiment, each memory access is looped through steps 210 to 213 until there are no more memory accesses for that particular sequence iterator. Then, as depicted in step 214, the next memory address in the sequence iterator is processed. In an embodiment, each memory address is looped through steps 208 to 214 until there are no more memory addresses for that particular sequence iterator. Then, as depicted in step 215, the next sequence iterator is processed. In an embodiment, each sequence iterator is looped through steps 207 to 215 until there are no more sequence iterators to process. Then, as depicted in step 216, the next active write port is processed. In an embodiment, each active write port is looped through steps 206 to 216 until there are no more active write ports to process. Then, as depicted in step 217, the next data background is processed. In an embodiment, each data background is looped through steps 205 to 217 until there are no more data backgrounds to process. Then, as depicted in step 218, the next address update is processed. In an embodiment, each address update is looped through steps 204 to 218 until there are no more address updates to process. Then, as depicted in step 219, the next address order is processed. In an embodiment, each address order is looped through steps 203 to 219 until there are no more address orders to process. Then, as depicted in step 220, the next algorithm is processed. In an embodiment, each algorithm in the identified test plan is looped through steps 202 to 220 until there are no more algorithms to process.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A memory built-in self-test ("MBIST") diagnostics system, comprising:
    a memory;
    at least one sequence iterator unit including a diagnostic analysis unit;
    a data compare unit;
    a processor;
    a tester configured to collect failure information from the diagnostic analysis unit associated with the a plurality of mis-compares, wherein:
    the at least one sequence iterator unit is configured to (i) generate read command and address instructions associated with an algorithm to provide to the memory and (ii) provide expected read data associated with the algorithm to the data compare unit,
    the data compare unit is configured to (i) compare the expected read data with an output of the memory and (ii) provide a result of the comparison to the diagnostic analysis unit,
    upon determining at least one mis-compare between the output of the memory and the expected read data, the diagnostic analysis unit is configured to generate a corresponding read command count associated with each mis-compare of the plurality of mis-compares,
    the failure information is collected via a test access method,
    the processor is configured to generate a bit fail map report based on the read command count, wherein the bit fail map report includes information associated with the at least one mis-compare, and
    the memory is tested with the algorithm for a plurality of passes, and during a first pass of a test corresponding to the algorithm:
        (i) failure information associated with a first mis-compare is collected, and the first mis-compare defines a most recent mis-compare; and
        (ii) failure information associated with subsequent mis-compares is blocked from collection; and
    during each subsequent pass of the test:
        (i) collection of failure information associated with each of the plurality of mis-compares is unblocked in response to a read command count associated with the plurality of mis-compares being greater than a read command count associated with the most recent mis-compare:
        (ii) failure information associated with a given mis-compare is collected, and the most recent mis-compare is set to the given mis-compare; and
        (iii) failure information associated with subsequent mis-compares is blocked from collection.

2. The diagnostics system of claim 1, wherein the test access method is a direct access interface.

3. The diagnostics system of claim 1, wherein the failure information includes (i) the output of the memory associated with the at least one mis-compare and (ii) the read command count associated with the at least one mis-compare.

4. The diagnostics system of claim 3, wherein the diagnostic analysis unit includes (i) a failing data bit ("FDB") register configured to store the output of the memory associated with the at least one mis-compare and (ii) a failing read count ("FRC") register configured to store the read command count associated with the at least one mis-compare.

5. The diagnostics system of claim 1, wherein, based on the collected failure information, the tester generates a log file including tester cycle and cycle count information for each mis-compare.

6. The diagnostics system of claim 5, wherein a log file is converted into a chip pad pattern format.

7. The diagnostics system of claim 6, wherein the bit fail map report is generated with an analysis software test, wherein the analysis software test receives, as inputs, the log file converted into the chip pad pattern format, a pattern control file, a plurality of mapping files, a test definition file, and a default algorithm file.

8. The diagnostics system of claim 7, wherein the analysis software test is executed up to a maximum value of the read command count.

9. The diagnostics system of claim 1, wherein the algorithm is one of (i) hard wired-in or (ii) programmable.

10. The diagnostics system of claim 9, wherein a programmable algorithm is stored in a shift register.

11. The diagnostics system of claim 1, further comprising an algorithm memory unit, wherein the algorithm memory unit provides the algorithm to the at least one sequence iterator unit.

12. The diagnostics system of claim 11, further comprising at least one other sequence iterator unit, wherein the algorithm memory unit simultaneously provides the algorithm to the at least one sequence iterator and the at least one other sequence iterator.

13. A diagnostics method for memory built-in self-test ("MBIST"), the method comprising:
　generating, with at least one sequence iterator unit, read command and address instructions associated with an algorithm to provide to a memory;
　providing, with the at least one sequence iterator unit, expected read data associated with the algorithm to a data compare unit;
　comparing, with the data compare unit, the expected read data with an output of the memory;
　providing, with the data compare unit, a result of the comparison to a diagnostic analysis unit;
　upon determining at least one mis-compare between the output of the memory and the expected read data, generating, with the diagnostic analysis unit, a corresponding read command count associated with each mis-compare;
　generating, with a processor, a bit fail map report based on the read command count, wherein the bit fail map report includes information associated with the at least one mis-compare; and
　collecting failure information via a test access method, wherein the memory is tested with an algorithm for a plurality of passes, wherein executing of the plurality of passes of the test comprises:
　　executing a first pass of a test corresponding to the algorithm, the executing of the first pass comprising:
　　　(i) collecting failure information associated with a first mis-compare, and the first mis-compare defines a most recent mis-compare;
　　　(ii) blocking collection of failure information associated with subsequent mis-compares; and
　　executing subsequent passes of the test, wherein execution of each subsequent pass comprises:
　　　(i) unblocking collection of failure information associated with each of the plurality of mis-compares in response to a read command count associated with the plurality of mis-compares being greater than a read command count associated with the most recent mis-compare;
　　　(ii) collecting failure information associated with a given mis-compare, and the most recent mis-compare is set to the given mis-compare; and
　　　(iii) blocking collection of failure information associated with subsequent mis-compares.

14. The diagnostics method of claim 13, wherein, based on the collected failure information, a tester generates a log file including tester cycle and cycle count information for each mis-compare, wherein the log file is converted into a chip pad pattern format.

15. The diagnostics method of claim 14, wherein the bit fail map report is generated with an analysis software test, wherein the analysis software test receives, as inputs, the converted log file, a pattern control file, a plurality of mapping files, a test definition file, and a default algorithm file.

* * * * *